United States Patent [19]

Hsiao et al.

[11] Patent Number: 5,885,750
[45] Date of Patent: Mar. 23, 1999

[54] TANTALUM ADHESION LAYER AND REACTIVE-ION-ETCH PROCESS FOR PROVIDING A THIN FILM METALLIZATION AREA

[75] Inventors: Richard Hsiao, San Jose; Neil Leslie Robertson, Palo Alto; Hugo Alberto Emilio Santini, San Jose; Clinton David Snyder, Los Gatos, all of Calif.

[73] Assignee: International Business Machines Corporation, Armonk, N.Y.

[21] Appl. No.: 942,777

[22] Filed: Oct. 2, 1997

[51] Int. Cl.⁶ ........................................................ G03F 7/26
[52] U.S. Cl. .............................. 430/314; 430/318; 427/96
[58] Field of Search ...................................... 430/311, 313, 430/314, 318; 427/96; 216/12

[56] References Cited

U.S. PATENT DOCUMENTS

| | | | |
|---|---|---|---|
| 4,315,985 | 2/1982 | Castellani | 430/314 |
| 4,919,768 | 4/1990 | Bladon | 204/15 |
| 4,927,505 | 5/1990 | Sharma et al. | 204/34.5 |
| 5,126,016 | 6/1992 | Glenning et al. | 205/125 |
| 5,151,168 | 9/1992 | Gilton et al. | 205/123 |
| 5,591,480 | 1/1997 | Weisman et al. | 216/13 |

OTHER PUBLICATIONS

"NiFe/Cu Seed Layer for Plating Coil Cu in Magnetic Recording Heads", IBM Technical Disclosure Bulletin, vol. 38, No. 06, Jun. 1995, p. 625.

"Process for Fabrication of High Resolution Plated Layers", IBM Technical Disclosure Bulletin, vol. 26, No. 7A, Dec. 1983, p. 3357.

Primary Examiner—Kathleen Duda
Attorney, Agent, or Firm—John H. Holcombe

[57] ABSTRACT

A method for providing a thin film metallization area on a substrate is disclosed comprising the steps of: depositing a Ta adhesion layer on the surface of the substrate seed layer, conducting a photo resist process on the Ta adhesion layer to define the thin film metallization area, including a remnant removal process to remove remnant photo resist process material in the thin film metallization area to the Ta adhesion layer, the Ta adhesion layer preventing the remnant removal from reaching the seed layer, conducting a Ta removal reactive-ion-etch process to remove the Ta adhesion layer in the thin film metallization area, so that the seed layer is exposed in the metallization area. A metal material may then be deposited in the metallization area.

16 Claims, 4 Drawing Sheets

TANTALUM ADHESION LAYER AND REACTIVE-ION-ETCH PROCESS FOR PROVIDING A THIN FILM METALLIZATION AREA

TECHNICAL FIELD

This invention relates to thin film processing, and, more particularly, to providing metallization areas for high aspect ratio thin film metal structures.

BACKGROUND OF THE INVENTION

High aspect ratio thin film structures are conventionally formed by photolithography and metallization, typically by plating. The thin film structures may include thin film microelectronic circuitry, thin film magnetic transducer structures, and microelectronic mechanical micro actuators.

Typically, metallization areas of substrates are provided with seed layers to promote the plating or deposition of the metal on the substrate. Adhesion layers have been employed for providing good adhesion between the substrate and the seed layers. For example, see coassigned U.S. Pat. No. 5,126,016, which provides a chromium (Cr) adhesion layer for thin film microelectronic circuitry. IBM Technical Disclosure Bulletin, Vol. 38, No. 6, Page 625, June 1995, discloses a nickel iron (NiFe) adhesion layer for a copper (Cu) seed layer for plating a coil copper layer for magnetic recording transducers.

In addition to the seed layer, the developing of the photo resist material overlying the seed layer needs to be complete to provide good definition of the thin film structure at the seed layer, and to provide vertical walls for the high aspect ratio thin film structure. In high aspect ratio structures, the trench should go to the bottom and fully reach the seed layer, but tends to round off if not completely exposed. It is difficult for the imaging light to penetrate to the bottom of the trench in such high aspect ratio structures while maintaining the desired feature dimension. "Scumming" and "foot" are remnants of photo resist that are not removed in the developing of high aspect ratio features. They are caused by either inadequate exposure or an insufficient developing. The developing, however, must be stopped before adversely affecting the feature dimension. Thus, it is difficult to complete the exposure and developing of the high aspect ratio structure with good critical dimension definition. Barrier layers have been used in controlling the developing processes for subsequent metallization. For example, U.S. Pat. No. 5,591,480 provides a titanium barrier layer to control liquid etching and provide a metallization pattern having various thicknesses and different metals exposed. IBM Technical Disclosure Bulletin, Vol. 26, No. 7A, Page 3357, December 1983, discloses a titanium layer to act as an etch stop in a complicated image transfer method for making a high aspect ratio plated structure. Such barrier layers themselves must be removed from the seed layer before metallization of the seed layers may be conducted. A difficulty of removing such a barrier layer is the potential damage of the seed layer as the result of the removal.

The adhesion between the typical seed layer and typical photo resist material is not very strong, due to the nature of the seed layer, such as copper (Cu) or nickel iron (Ni—Fe), and the organic photoresist. The inadequate adhesion may cause lift off, or delamination, of the photo resist under stress.

The photolithography and metallization of high aspect ratio thin film structures cause high stress which may lead to adhesions failure and plating under the photo resist defining the metallization area. First, the developing must be complete to provide a high definition of the metallization area. However, the extra developing required to insure that the developing is complete, tends to etch into the sidewalls and to stress the adhesion between the photo resist layer and the seed layer. Other processes than extra developing may be used to complete the removal process, such as aggressive ashing, using oxygen ($O_2$). Such ashing, however, may cause seed layer oxidation and may cause critical dimension loss as the $O_2$ starts to etch laterally. Second, the metallization, typically by plating, causes stress, which may result in delamination of the photo resist from the seed layer. Any tendency toward separation between the photo resist and the seed layer resulting from the above stresses, may therefore result in underplating. Plating under the photo resist would result in thin film metal structures that are not well defined, destroying the thin film critical dimensions, possibly leading to changes in the characteristics of the circuits, inefficient thin film magnetic transducers, and poor performance actuators.

In addition, the excessive etch or the ashing to provide complete removal of the photo resist material or of a barrier layer may adversely affect the effectiveness of the seed layer, e.g., if oxidized, and not insure an effective plating process.

SUMMARY OF THE INVENTION

It is an object of the present invention to reduce the tendency to underplating and to resist scumming and foot of high aspect ratio metallization features, while maintaining the effectiveness of the seed layer.

Disclosed are an adhesion layer and a method for providing a thin film metallization area on a substrate. The method comprises the steps of: depositing a tantalum (Ta) adhesion layer on the surface of the substrate seed layer, then conducting a photo resist process on the Ta adhesion layer to define the thin film metallization area, and a remnant removal reactive-ion-etch process to remove remnant photo resist process material in the thin film metallization area, with the Ta adhesion layer preventing the remnant removal reactive-ion-etch process from interacting with the seed layer, then conducting a Ta removal reactive-ion-etch process to remove the Ta adhesion layer in the thin film metallization area, so that the seed layer is exposed in the metallization area, and then plating a metal material in the metallization area.

The remnant removal reactive-ion-etch process may comprise an oxygen ($O_2$) reactive-ion-etch process to remove remnant photo resist process material in the thin film metallization area, and the Ta adhesion layer prevents the $O_2$ reactive-ion-etch process from oxidizing the seed layer. The Ta removal reactive-ion-etch process may comprise a flourine (F) reactive-ion-etch process to not adversely affect the seed layer while removing the Ta adhesion layer in the thin film metallization area.

For a fuller understanding of the present invention, reference should be made to the following detailed description taken in conjunction with the accompanying drawings.

DETAILED DESCRIPTION OF THE INVENTION

Figure 1:
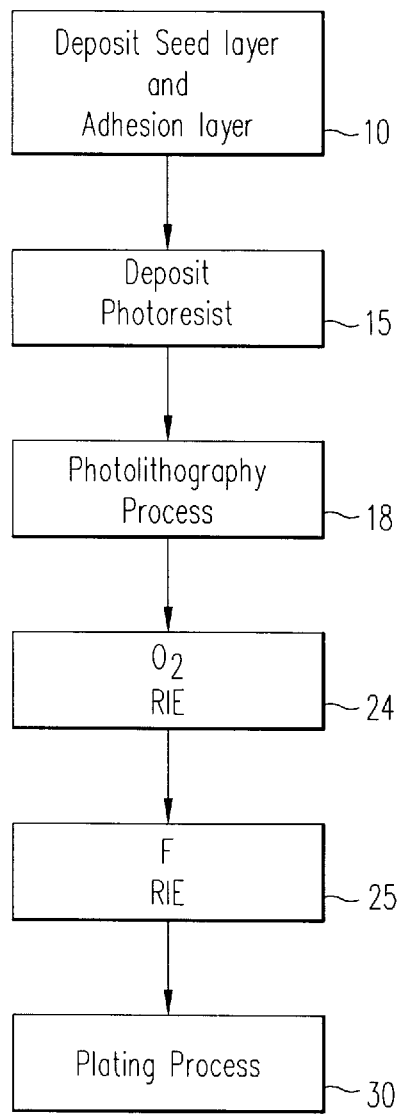
FIG. 1 is a flow chart of an embodiment of the process for providing a thin film metallization area of the present invention.

Referring to FIGS. 1 and 2, an embodiment of the present invention is disclosed for providing a thin film metallization area on a substrate. In FIG. 1 and 2A, step 10 comprises deposition of a seed layer 11 and an adhesion layer 12 on a substrate 14. The seed layer 11 may, for example, be copper (Cu) or nickel iron (Ni—Fe). Typically, a Cu seed layer is employed for thin film microelectronic circuitry, and thin film magnetic transducer electrical structures such as coils. Typically, a Ni—Fe seed layer is employed for thin film magnetic transducer magnetic structures, such as pole pieces and microelectronic mechanical micro actuators. Gold (Au) may also be employed as a seed layer, preferably for microelectronic circuitry.

In accordance with the present invention, the adhesion layer applied in step 10 is a layer of tantalum (Ta) deposited, preferably to a thickness of between 20 Angstroms and 100 Angstroms. Both the seed layer 11 and the adhesion layer 12 are preferably sputtered in an RF sputtering process, and both may be sputtered in the same process chamber, with the sputtering targets changed between layers.

The Ta adhesion layer 12 has the property of adhering well both to the seed layer 11 and the photo resist layer. The Ta adhesion layer 11 also has the property of producing a tenacious native oxide in a $O_2$ atmosphere, as will be explained hereinafter, so that even if an adhesion failure occurs, plating will not initiate under the resist.

Figure 2A:
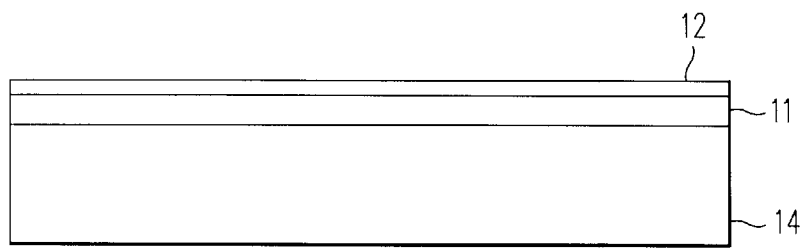
FIGS. 2A through 2G are cross-sectional views of an embodiment of a thin film metallization structure in various stages of manufacture in accordance with the present invention.
Figure 2B:
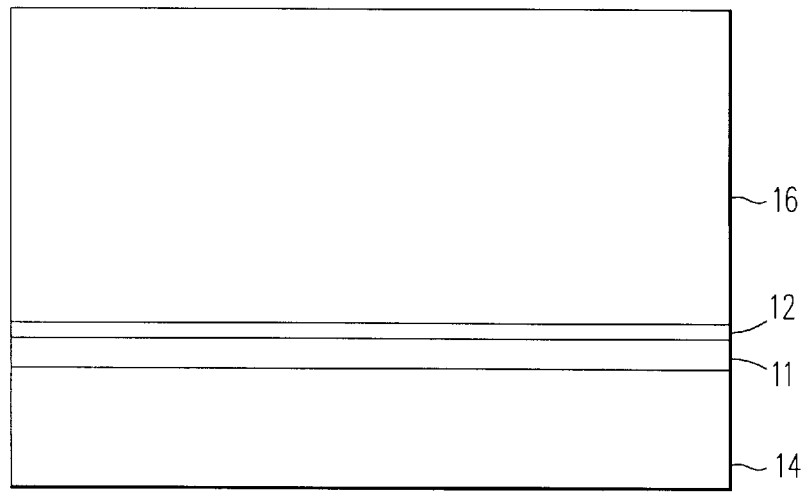

In step 15 of FIG. 1, a layer of conventional photo resist material 16 in FIG. 2B is deposited over the Ta adhesion layer 12. The adhesion of the photo resist material 16 to the Ta layer 12 is improved when compared to the conventional deposition of the photo resist material directly on the seed layer 11, described supra. The improved adhesion will resist undercutting of the plating of the metallization, as will be explained.

Figure 2C:
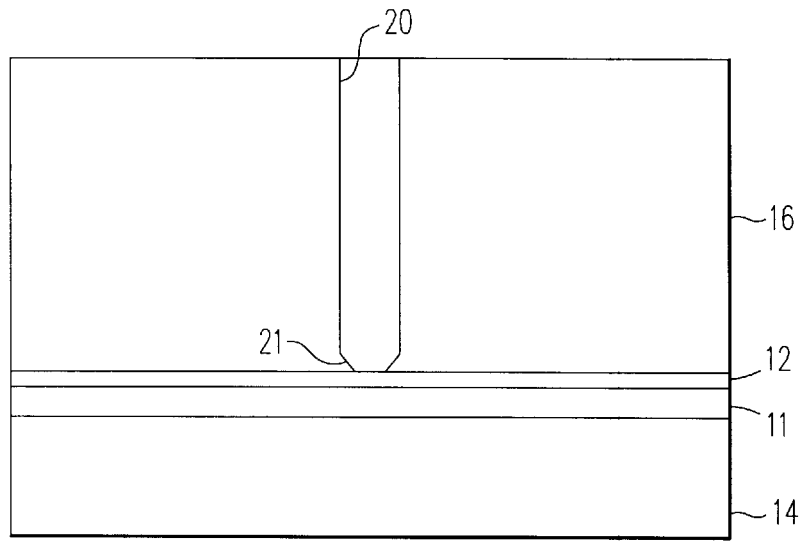
Figure 2D:
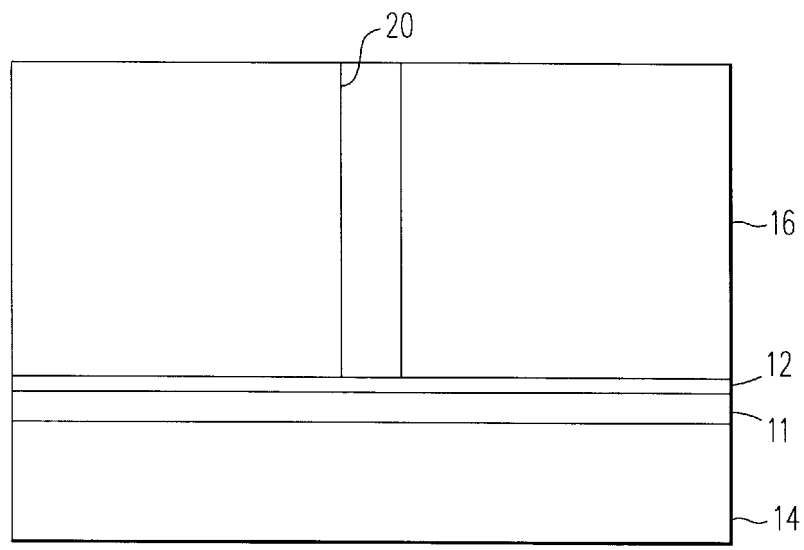

A conventional photolithography process is conducted in step 18 to define the thin film metallization area. The photo resist process includes spinning a resist layer on Ta, baking the photo resist layer, photolithographic exposure of the area where the features are to be defined, and developing the resist to remove the exposed resist. A trench 20 is developed in the photo resist material. A high aspect ratio trench is difficult to fully expose in that the imaging light may not penetrate fully through the photo resist layer 16 without adversely affecting the feature dimensions. Thus, as shown in FIG. 2C, the developed trench 20 may leave remnant photo resist material 21, which may be called resist "foot" or "scumming". The trench may therefore not be well defined at this stage.

Step 24 is a remnant removal step at the conclusion of the photo resist process. It may comprise a reactive-ion-etching step, preferably of $O_2$, to remove the resist foot and scumming to produce a well defined metallization area trench 20 in FIG. 2D. The reactive-ion-etching process is highly directional and does not etch into the sidewalls of the trench, thereby producing a vertical wall on each side of the trench 20 for providing the well defined metallization area. The Ta adhesion layer 12 oxidizes slowly in the oxygen plasma and forms a tenacious native oxide so that the oxygen plasma does not penetrate through the Ta 12 to reach and attack the seed layer 11. Further, the oxide tends to adhere to the Ta metal well to provide the tenacious native oxide with complete, pin hole free coverage of the seed layer 11. Thus, the seed layer 11 laterally of the trench 20 is protected by the Ta adhesion layer 12 so that, even if an adhesion failure occurs, plating will not initiate on the seed layer 11 under the resist 16.

Figure 2E:
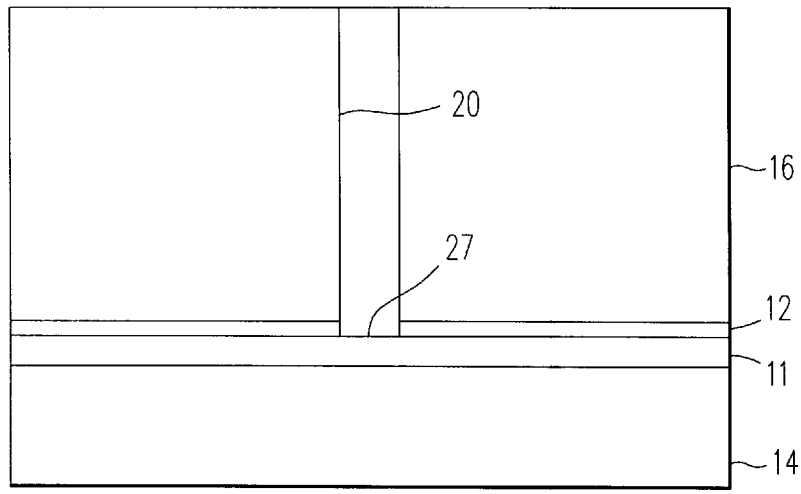

A flourine (F) reactive-ion-etching step 25 is then conducted to remove the Ta adhesion layer 12, in FIG. 2E, from the bottom 27 of the trench 20, again preserving the size of the metallization area due to the directionality of the reactive-ion-etching process. It is necessary to remove all of the Ta at the bottom 27 of the trench 20 so that the subsequent metallization will adhere to the seed layer 11. Thus, slight overetching is conducted to assure removal of all of the Ta adhesion layer 12 at the bottom 27 of the trench 20. For example, if the Ta adhesion layer 12 thickness is 80 Angstroms, and if the F reactive-ion-etching process 25 progresses at a rate of 8 Angstroms/sec., the F reactive-ion-etching process 25 is conducted for 12 to 30 seconds.

As an option, a hydrogen-containing plasma, such as argon-hydrogen ($Ar/H_2$) or nitrogen-hydrogen ($N_2/H_2$) low energy plasma treatment may then be applied to condition the seed layer 11 at the bottom 27 of the trench 20 that was exposed to the F reactive-ion-etch during the Ta overetch.

Figure 2F:
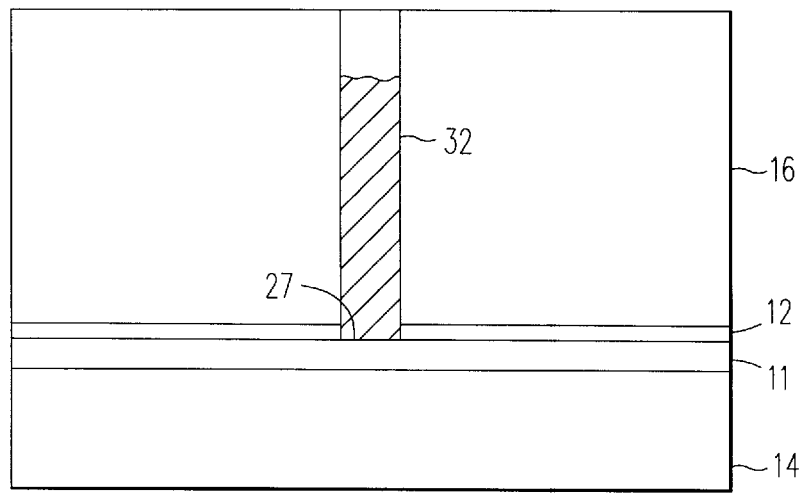
Figure 2G:
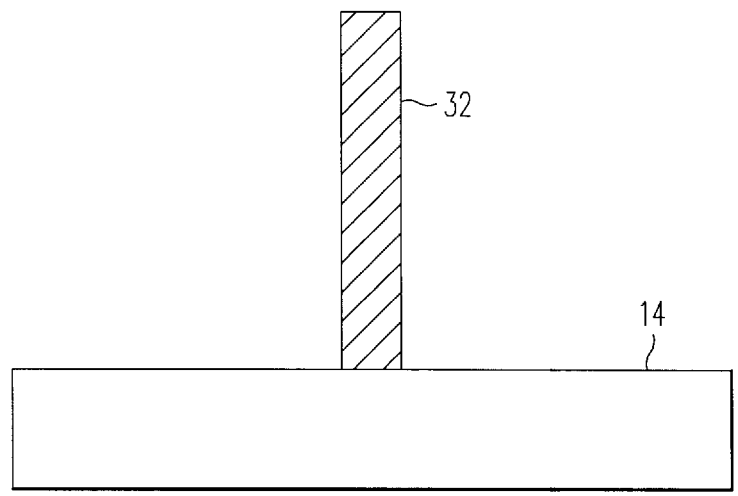

FIGS. 2F and 2G illustrate a conventional metal plating process 30 of FIG. 1 to form a high aspect ratio metalized structure 32. Because of the presence of the Ta adhesion layer 12 in FIG. 2F between the photo resist 16 and the seed layer 11, plating stress and lifting will be resisted. Thus, underplating of the photo resist layer 16 is eliminated.

The photo resist material 16 may then be removed by a conventional wet etch process as part of the metal plating process 30. The conventional dry etch process such as ion milling or sputtering may then be used to remove the exposed Ta adhesion layer 12 and the seed layer 11.

The metallized structure 32 may, for example, be copper (Cu) or nickel iron (Ni—Fe). Typically, a Cu metallized structure is employed for thin film microelectronic circuitry, and thin film magnetic transducer electrical structures such as coils. Typically, a Ni—Fe metallized structure is employed for thin film magnetic transducer magnetic structures, such as pole pieces, and microelectronic mechanical micro actuators. Gold (Au) and other metals are alternatives that may be utilized for metallization and employed for thin film structures.

Alternative reactive-ion-etching process steps 24 and 25 may be utilized and alternative plating process steps 30 may be utilized without departing from the scope of the present invention. The reactive-ion-etching steps 24 and 25 are required in the process of the present invention to provide an unidirectional process to prevent lateral etching and undercutting of the photo resist layer 16.

While the preferred embodiments of the present invention have been illustrated in detail, it should be apparent that modifications and adaptations to those embodiments may occur to one skilled in the art without departing from the scope of the present invention as set forth in the following claims.

We claim:

1. A method for preparing at least one thin film metallization area for metallization on a substrate having a seed layer, comprising the steps of:

depositing a Ta adhesion layer on the surface of said seed layer of said substrate;

conducting a photo resist process on said Ta adhesion layer to define said thin film metallization area;

conducting a reactive-ion-etch process to remove remnant photo resist process material from said photo resist process step in said thin film metallization area, producing walls to said Ta adhesion layer to produce a well defined said thin film metallization area, said Ta adhesion layer preventing said reactive-ion-etch process from interacting with said seed layer; and conducting a Ta removal reactive-ion-etch process to remove said Ta adhesion layer in said thin film metallization area, so that said seed layer is exposed in said metallization area.

2. The method for preparing at least one thin film metallization area of claim 1, wherein said step of conducting a reactive-ion-etch process to remove remnant photo resist process material comprises an $O_2$ reactive-ion-etch process, and said Ta adhesion layer prevents said $O_2$ reactive-ion-etch process from oxidizing said seed layer.

3. The method for preparing at least one thin film metallization area of claim 2, wherein said Ta removal reactive-ion-etch process comprises an F reactive-ion-etch process.

4. The method for preparing at least one thin film metallization area of claim 3, wherein said metallization area is a high aspect ratio trench.

5. The method for preparing at least one thin film metallization area of claim 4, wherein said Ta adhesion layer depositing step comprises RF sputtering or ion beam deposition of Ta.

6. The method for preparing at least one thin film metallization area of claim 5, additionally comprising the step of:
   subsequent to said Ta removal reactive-ion-etch step, applying a hydrogen-containing plasma treatment to condition said seed layer for plating.

7. A method for providing at least one thin film metal structure on a substrate having a seed layer comprising the steps of:
   depositing a Ta adhesion layer on the surface of said seed layer of said substrate;
   conducting a photo resist process on said Ta adhesion layer to define a thin film metallization area;
   conducting a reactive-ion-etch process to remove remnant photo resist process material from said photo resist process step in said thin film metallization area, producing walls to said Ta adhesion layer to produce a well defined said thin film metallization area, said Ta adhesion layer preventing said reactive-ion-etch process from interacting with said seed layer;
   conducting a Ta removal reactive-ion-etch process to remove said Ta adhesion layer in said thin film metallization area, so that said seed layer is exposed in said metallization area; and
   depositing a metal material in said metallization area.

8. The method for providing at least one thin film metal structure of claim 7, wherein said step of depositing a metal material in said metallization area comprises plating a metal in said metallization area.

9. The method for providing at least one thin film metal structure of claim 8, wherein said metal plated in said step of depositing a metal material in said metallization area comprises Cu, Ni—Fe or Au.

10. The method for providing at least one thin film metal structure of claim 9, wherein said metal plated in said step of depositing a metal material in said metallization area comprises Cu for a magnetic thin film transducer coil.

11. The method for providing at least one thin film metal structure of claim 9, wherein said metal plated in said step of depositing a metal material in said metallization area comprises Ni—Fe for a magnetic thin film transducer pole piece.

12. The method for providing at least one thin film metal structure of claim 7, wherein said step of conducting a reactive-ion-etch process to remove remnant photo resist process material comprises an $O_2$ reactive-ion-etch process, and said Ta adhesion layer prevents said $O_2$ reactive-ion-etch process from oxidizing said seed layer.

13. The method for providing at least one thin film metal structure of claim 12, wherein said Ta removal reactive-ion-etch process comprises an F reactive-ion-etch process.

14. The method for providing at least one thin film metal structure of claim 13, wherein said metal structure is a high aspect ratio trench.

15. The method for providing at least one thin film metal structure of claim 14, wherein said Ta adhesion layer depositing step comprises RF sputtering or ion beam deposition of Ta.

16. The method for providing at least one thin film metal structure of claim 15, additionally comprising the step of:
   subsequent to said Ta removal reactive-ion-etch step, applying a hydrogen-containing plasma treatment to condition said seed layer for plating.

* * * * *